United States Patent [19]

Holloway

[11] Patent Number: 5,529,981

[45] Date of Patent: *Jun. 25, 1996

[54] PROCESS AND APPARATUS FOR PREPARING BIAXIALLY TEXTURED MATERIALS USING ANISOTROPY IN THE PARAMAGNETIC SUSCEPTIBILITY

[76] Inventor: Alex Holloway, 320 N. 33rd St., Omaha, Nebr. 68131

[ * ] Notice: The term of this patent shall not extend beyond the expiration date of Pat. No. 5,079,225.

[21] Appl. No.: 94,638

[22] Filed: Jul. 20, 1993

Related U.S. Application Data

[63] Continuation of Ser. No. 847,613, Mar. 5, 1992, abandoned, and Ser. No. 53,073, Apr. 26, 1993, abandoned, which is a continuation-in-part of Ser. No. 847,613, Mar. 5, 1992, abandoned.

[51] Int. Cl.$^6$ ................................................. H01L 39/24
[52] U.S. Cl. .................... 505/400; 505/727; 505/779; 501/152; 252/521
[58] Field of Search ........................... 505/400, 727, 505/779; 252/521; 501/152

[56] References Cited

U.S. PATENT DOCUMENTS

| | | | |
|---|---|---|---|
| 4,939,121 | 7/1990 | Rybka | 505/1 |
| 4,942,151 | 7/1990 | Capone et al. | 505/1 |
| 4,956,339 | 9/1990 | Yamazaki | 505/1 |
| 4,990,493 | 2/1991 | Lay | 505/1 |
| 5,057,486 | 10/1991 | Arendt et al. | 505/1 |
| 5,079,225 | 1/1992 | Holloway | 505/1 |
| 5,096,880 | 8/1992 | Rybka | 505/1 |
| 5,168,096 | 12/1992 | Tournier | 505/1 |

Primary Examiner—C. Melissa Bonner
Attorney, Agent, or Firm—Henderson & Sturm

[57] ABSTRACT

The present invention discloses a process and apparatus for forming textures in materials. It uses so called "normal aligners" having an anisotropy in the paramagnetic susceptibility within a magnetic field having compositions $REBa_2Cu_3O_x$ or $Bi(Tl)_2Sr_2Ca_{1-y}RE_yCu_2O_x$, where RE=Eu, Er, Tm, and Yb. One version of the process for preparing bulk and elongated objects comprises two steps. In the first step the material is uniaxially aligned. In the second step uniaxially aligned material is heated to a temperature approaching its melting point while a magnetic field of at least $10^4$ Oe, with a direction perpendicular to the axis of uniaxial alignment is simultaneously applied. The process results in biaxially, highly textured bulk and elongated materials.

36 Claims, 7 Drawing Sheets

PROCESS AND APPARATUS FOR PREPARING BIAXIALLY TEXTURED MATERIALS USING ANISOTROPY IN THE PARAMAGNETIC SUSCEPTIBILITY

CROSS REFERENCE TO RELATED APPLICATIONS

The present application is a continuation of United States patent application Ser. No. 07/847,613 filed Mar. 5, 1992 entitled "Process and Apparatus for Preparing Biaxially Textured Materials Using Anisotropy in the Paramagnetic Susceptibility", now abandoned, and United States patent application Ser. No. 08/053,073 filed Apr. 26, 1993 for "Process and Apparatus for Preparing Biaxially Textured Materials Using Anisotropy in the Paramagnetic Susceptibility", now abandoned, which in turn is a continuation-in-part of United States patent application Ser. No. 07/847,613 filed Mar. 5, 1992, now abandoned.

TECHNICAL FIELD

The present invention discloses a process and apparatus for forming textures in materials. It uses so called "normal aligners" having an anisotropy in the paramagnetic susceptibility within a magnetic field having compositions $REBa_2Cu_3O_x$ or $Bi(Tl)_2Sr_2Ca_{1-y}RE_yCu_2O_x$, where RE=Eu, Er, Tm, and Yb.

BACKGROUND OF THE INVENTION

The present invention is directed to a process for forming bi-axially highly textured extended objects (such as tapes and wires) and bulk objects (including single-crystals), by pre-aligning materials using a variety of approaches and then applying a strong magnetic field ($H \geq 10^4$ Oe) and high (near melting point) temperatures to materials having anisotropy in the paramagnetic susceptibility.

Standard conductors obey Ohm's law. As charges move through a conductor they produce an electric field that creates an electric current. The current density (J) of a conductor having a cross-sectional area A is defined as follows:

$$J = I/A$$

where I is the current running through the conductor. If a constant potential difference is maintained across a conductor, the current (I) remains constant. If the current density in a conductor is proportional to the electric field within the conductor, the conductor is said to obey Ohm's law:

$$J = \sigma E$$

where $\sigma$ is the constant of proportionality and E is the electric field strength.

The resistance of a conductor may be calculated according to the following expression:

$$R = V/I$$

where V is the potential difference, and the resistivity of a material is found according to the following expression:

$$\rho = 1/\sigma$$

In the early part of this century it was discovered that resistance dropped to zero in some materials, such as mercury (Hg), at low temperatures. Materials having an electrical resistance of zero (R=0) are called superconductors. Such materials do not obey Ohm's law.

Theories such as the BCS Theory of Superconductivity and the Cooper Electron Pairing Theory attempt to explain the lack of resistance in superconducting materials below $T_c$ (temperature at which resistance equals zero). While the BCS theory has not been entirely successful with new high $T_c$ ceramics the Cooper Electron Pairing Theory is commonly considered valid.

Recent developments in superconductor technology such as Paul Chu's synthesis of a material superconducting at 95°–96° K. ($YBa_2Cu_3O_x$, where $x \approx 7$) and then the recent discoveries of Bi- and Tl-based superconducting ceramic materials (for instance, $Tl(Bi)Ba_2Ca_{n-1}Cu_nO_{2n+3}$ where n in an integer selected from the set 1, 2, 3, and 4) with a highest $T_c$ of 125° K. have lead to very promising directions.

Now that economical $T_c$'s have been achieved, new problems must be confronted and solved. The most crucial problem is critical current density $J_c$ (maximum current density at a given temperature and magnetic field above which a material ceases to be superconducting). This is true since low current densities ($J_c$) require larger HTSC (high termperature superconducting ceramics) cross-sections. Naturally, this results in a cost increase. The problem can be addressed by making better quality materials that allow for a significantly larger $J_c$. The objective of the present invention is to make HTSC materials with high $J_c$'s.

For many technological applications $J_c$ should have a magnitude of about $10^5$ to $10^6$ A/cm$^2$ at 77 K. In single-crystals $RE-Ba_2Cu_3O_x$ (where RE is a rare earth) a $J_c$ of $\approx 3 \times 10^6$ A/cm$^2$ and higher has been obtained. See, S. Jin, et al. 51 Applied Physics Letters 203 et seq. (1987).

However, $J_c$ is strongly anisotropic and is sufficient only for certain directions (for current flow in the Cu-O basal plane). In polycrystalline untextured bulk and elongated samples, where grains are randomly oriented, superconducting current flows along "good" directions in some grains and along "bad" directions in other grains, which results in an unacceptably low $J_c$ ($\approx 10^2$ A/cm$^2$). Additionally, a mismatch in the a-b planes has an adverse effect on $J_c$. This adverse effect manifests as so called weak links between adjacent grains.

One logical approach to enhancing $J_c$ is to prepare grain oriented polycrystalline ceramics, or to turn or regrow grains in such a way that current flows along "good" directions only. It is furthermore crucial to liquidate the mismatch in a-b axes registry. When both these goals are achieved, it becomes possible to attain very high $J_c$'s in textured compacts approaching the ones achieved on the single-crystal samples.

Textured material is a material in which the vast majority of the grains within the material have the same crystallographic orientation with respect to some reference direction. The highest probability texture direction is called the "preferred orientation."

A texture is often specified with respect to the external directions of the material under consideration, for example, to the plane and edges of a tetragonally shaped bulk sample, or to the axis of a wire. Texture may be uniaxial or planar, such as "c-axis texture," wherein the c-axes of the majority of grains are approximately parallel to one another. Texture may also be bi-axial or three-dimensional, when not only the c-axis of the majority of grains is aligned but one additional axis, located within the a-b plane, for the majority of grains is also aligned. In the latter case the grained polycrystalline material most closely matches the lattice characteristics associated with single crystals.

Very often textured materials have superior conducting, mechanical, electromagnetic, wave alternating and transducing properties, etc., and the demand for such material is increasing. For example, in the area of high temperature superconducting ceramics (HTSC) highly grain-oriented materials are desirable because they exhibit high critical current densities, as well as high critical magnetic fields favored in single crystals and textured samples.

One method of producing texture is to influence the grain growth process. As grain growth occurs in a material, some grains grow at the expense of their neighbors. If a means can be found to enhance the growth of grains selected on the basis of their crystallographic orientations, then highly textured material in which the vast majority of the grains are crystallographically oriented may be obtained.

A common method of producing such a selection mechanism is to utilize a temperature gradient during grain growth for materials with a large anisotropy in crystal growth directions (used in, for example, melt-textured growth technique). Another approach is to utilize mechanical pressure. For example, rolling thin sheets of certain metals causes preferential grain alignment.

In the present invention grains in the first step are uniaxially prealigned by using a magnetic field, compression or other means. In a second step a difference in the magnetic component of energy is provided between grains favorably and unfavorably oriented with respect to the direction of an applied magnetic field. This difference in energy is due to two factors, (1) anisotropy in the paramagnetic/diamagnetic susceptibility (the difference in the grain magnetic susceptibilities in the directions parallel and not parallel to the magnetic field); and (2) magnitude of the magnetic field itself (the energy term when the atomic magnetic moments are not saturated is proportional to the square of the magnetic field).

In another version of the process, the material is heated to a temperature exceeding its melting point, then it is cooled in the presence of a temperature gradient while a strong magnetic field is simultaneously applied. Directions of the temperature gradient and magnetic field select favored crystallographic orientations during melt (or partial melt) solidification. Additionally, the strong magnetic field may rotationally realign grains and grain nucleous in the melt in a preferred direction. The stronger the magnetic field, the faster may be the cooling rate.

This implies that in order to maximize the magnetic energy term it is necessary to use the maximum achievable magnetic field. Magnetic fields of $10^4$ to $2\times10^5$ Oe are currently producible with commercially available equipment. Magnetic fields of the strength above $3\times10^5$ Oe are available in a few of the best magnetic facilities in the world.

When a material with an anisotropic magnetic susceptibility is placed in a magnetic field, the energy of grains favorably oriented with respect to the field direction is lower than that of other orientations.

When a material is heated to a near melting point temperature and grain growth occurs, the larger size grains, due to a surface energy term (surface energy density is smaller for grains having smaller curvature (or larger size)), expand at the expense of the smaller grains. This process does not generally result in a preferred orientation. However, if a material is placed in a sufficiently strong magnetic field, so that the magnetic term dominates the surface energy term, the grains with favorable crystallographic orientation will grow at the expense of adjacent unfavorably oriented grains without regard to their size. Additionally, if a sufficient amount of liquid phase is present, grains can be rotationally realigned in the favorable direction. This process results in textured samples.

SUMMARY OF THE INVENTION

One version of the process for preparing bulk and elongated objects comprises two steps. In the first step the material is uniaxially aligned using a magnetic field, mechanical compression, or the like. The second step consists of heating this uniaxially aligned material to a temperature approaching its melting point while a magnetic field of at least $10^4$ Oe, with a direction perpendicular to the axis of alignment produced in the first step, is simultaneously applied. The process results in bi-axially, highly textured bulk and elongated materials.

In another version of the process, the melt-textured growth technique is combined with magnetic annealing. The material is heated to a temperature exceeding its melting point then cooled in the presence of a temperature gradient while a magnetic field of at least $10^4$ Oe is simultaneously applied. The direction of the magnetic field is set perpendicular to the direction of the temperature gradient. This process also results in bi-axially, highly textured materials.

The produced biaxially (or three-dimensionally) highly textured elongated and bulk materials exhibit high critical current densities below critical superconducting temperature.

Accordingly, it is a primary object of the present invention to produce a high degree of texture in polycrystalline materials.

Another object of the present invention is to provide a process and apparatus for forming highly, three-dimensionally (3-D) textured elongated samples (such as tapes, wires and films) and bulk samples from any material possessing an anisotropy in the paramagnetic or diamagnetic susceptibility, and more particularly from HTSC ceramics.

Another object of the present invention is to produce single crystals from textured samples.

Another object of the present invention is to produce textured HTSC bulk and elongated ceramics with considerably higher values of superconducting critical current density ($J_c$).

Another object of the present invention is to provide a process and apparatus for producing materials exhibiting a 3-D anisotropy in thermal conductivity.

Another object of the present invention is to provide a process and apparatus for producing materials exhibiting a 3-D mechanical anisotropy.

Another object of the present invention is to provide a process and apparatus for producing materials exhibiting a 3-D optical anisotropy.

Another object of the present invention is to provide a process and apparatus for producing materials exhibiting a 3-D anisotropy in electrical conductivity.

Another object of the present invention is to provide a process and apparatus for economically producing materials having a high degree of 3-D texture.

Another object of the present invention is to provide a process and apparatus for producing specialized materials having one or more magnetic, thermal, electrical, or optical anisotropies.

In accordance with the present invention, a process is provided for forming textures. Textures may be formed by first uniaxially aligning grains by applying a magnetic field(s), mechanical pressure, gravitational field, or the like to the material. In a second step, the process comprises heating the material in a strong ($\geq 10^4$ Oe) magnetic field. The process also comprises heating the initial sample at a temperature approaching the material's melting point so as to initiate the grain growth process (the material is heated at this temperature until substantial grain growth occurs (more than insubstantial grain growth)) and enable grains to realign in the field.

The temperature may also be cycled above the material's melting point for short periods in order to speed up the diffusion rate and at the same time avoid phase separation of the material. The temperature may also be decreased slowly from the one above (up to 200° K.) the melting point to produce solidified material with 3-D alignment. A magnetic field of at least $10^4$ Oe is simultaneously applied in order to modify the grain growth and nucleation processes and to rotate grains in the field so that highly textured material is produced.

In another version of the process the melt-textured growth technique is combined with magnetic annealing. The material is heated to a temperature exceeding its melting point; then it is cooled in the presence of a temperature gradient while a magnetic field of at least $10^4$ Oe is simultaneously applied.

DESCRIPTION OF THE PREFERRED EMBODIMENTS

Figure 1:
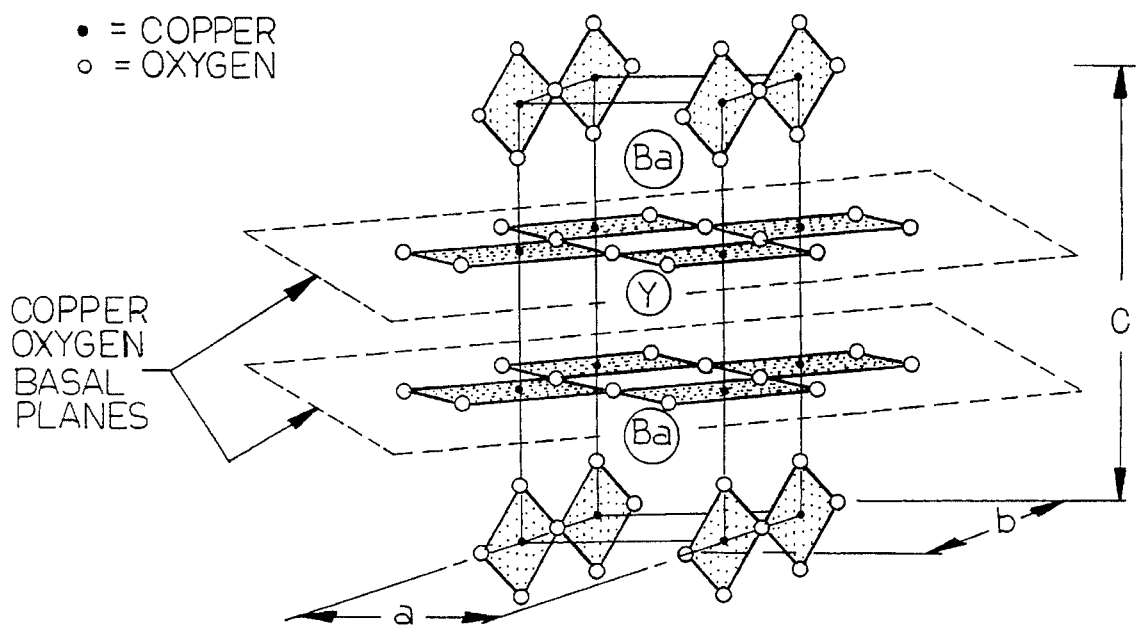
FIG. 1 is a diagrammatic illustration of the structure of $YBa_2Cu_3O_x$, where $x \approx 7$.

The process and apparatus of the present invention are based upon the practical exploitation of the relationship between the crystal structure and the anisotropy in the paramagnetic or diamagnetic susceptibility of certain materials.

Specifically, this relationship is utilized in a two-step process:

1. (a) Prealigning the superconducting grains in a magnetic field of the order of 100 Oe and larger. The resulting material is highly, uniaxially (c-axis) textured with the crystallographic orientation of grains corresponding to the maximum paramagnetic or diamagnetic susceptibility lying parallel to the applied field, or (b) Prealigning the grains by mechanical means (utilizing mechanical rolling, compression or force of gravity, etc.). The resulting material (because of the plate like shape of the grains with a and/or b lengths relatively long and c length relatively short) after compaction is also highly textured with the crystallographic orientation of the c-axis of grains generally parallel to the applied mechanical force or gravitational force;

2. Heating the material to a temperature approximating the material's melting point (the temperature at which intensive grain growth occurs) while simultaneously applying a strong (of the order of $10^5$ Oe) magnetic field to direct grain growth. The direction of the magnetic field is set perpendicular to the c-axis direction of the texture produced in step one. The resulting material is highly and three-dimensionally textured with the crystallographic orientation of grains corresponding to the maximum paramagnetic susceptibility lying parallel to the applied magnetic field. Additionally, where sufficient space is available, grains with the most favorable orientation tend to grow to very large sizes, and once extracted from the matrix these crystals are as large as single crystals produced by other techniques.

Specifically, this relationship is also utilized in another version of the process where the melt-textured growth technique is combined with magnetic annealing. The material is (1) heated to a temperature exceeding its melting point (melting point ($\approx 1010°$ C. for $YBa_2Cu_3O_x$) is a temperature when melting begins), (2) cooled in the presence of a temperature gradient while a magnetic field of at least $10^4$ Oe is simultaneously applied. The direction of the magnetic field is set perpendicular to the direction of the temperature gradient. The process also results in bi-axially, highly textured materials.

The following description discusses the nature of paramagnetic anisotropy, mechanical, heat and magnetic field treatments, and some of the patented features of the present invention which patentably distinguish it from the prior art.

If a crystal or grain has an anisotropic paramagnetic or diamagnetic susceptibility ($\chi$) in its normal state, and is placed in a magnetic field H, the energy is minimal when the axis of maximum $\chi$ is parallel to the field. This tends to rotate the grain to an angle minimizing its energy in the field. Various sources of magnetic anisotropy for different materials may be present. The following discussion relates to high $T_c$ compounds. However, the principles hereinafter discussed are valid for all materials having an anisotropic magnetic susceptibility.

Figure 2:
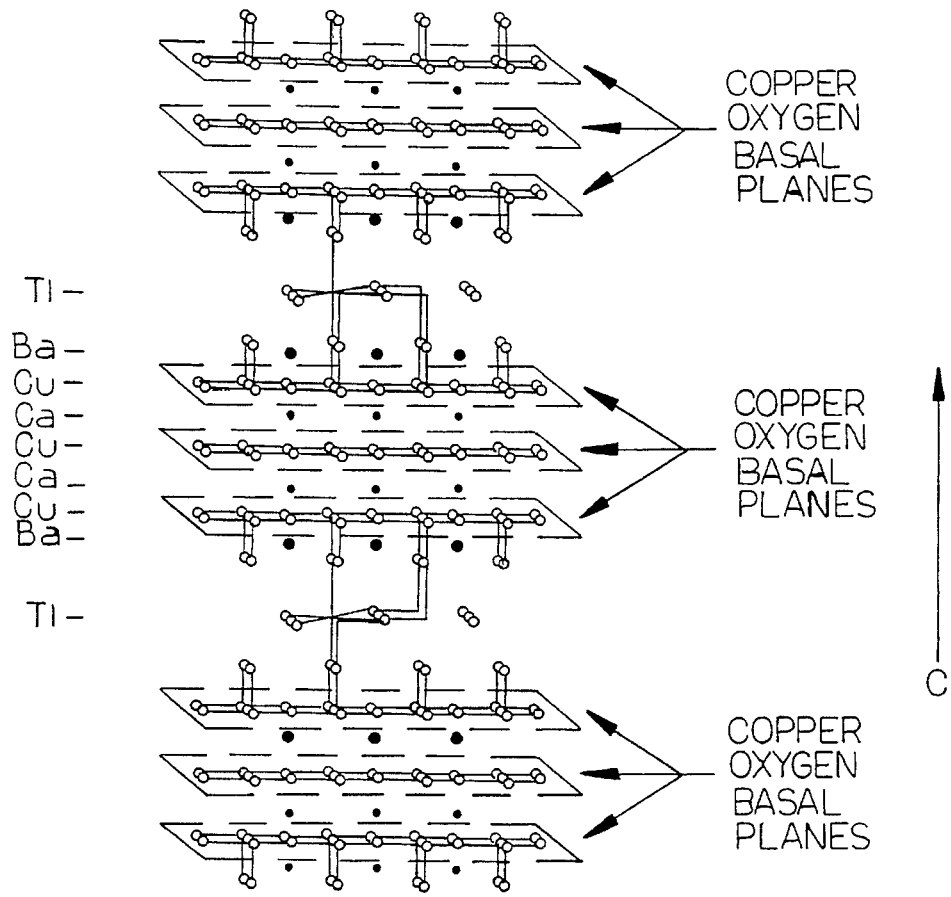
FIG. 2 is a diagrammatic illustration of the structure of $TlBa_2Ca_{n-1}Cu_nO_{2n+3}$ (where n=3)

The general feature of new high $T_c$ compounds is that the susceptibility parallel to the c direction $\chi_c$, (the c direction is perpendicular to the Cu-O basal plane) is different from susceptibility in the a-b plane and perpendicular to the c direction $\chi_{ab}$ (See FIGS. 1 and 2). FIG. 1 illustrates the believed crystal lattice structure of $YBa_2Cu_3O_x$. FIG. 1 also depicts the Cu-O basal plane, and the a,b, and c axes of the crystal lattice structure of $YBa_2Cu_3O_x$. In $YBa_2Cu_3O_x$ the anisotropy $\Delta_\chi \equiv \chi_c - \chi_{ab}$ above $T_c$ ($\approx 1 \times 10^{-4}$ cm$^3$/mol is positive and is probably due to anisotropy in the Van Vleck paramagnetic susceptibility of the Cu-O layers.

In contrast, when yttrium (Y) is replaced by a magnetic rare earth (RE) element, the main source of anisotropy is the single ion anisotropy of the RE ion. For example, the anisotropy for RE=Ho is somewhat larger (while having the same sign) than where RE=Y. In contrast, for RE=Eu the anisotropy (with an opposite sign) has a value at room temperature $\Delta_\chi = -6 \times 10^{-4}$ cm$^3$/mol.

$YBa_2Cu_3O_x$ is an example of the so called "parallel aligners" (where the preferred direction of the magnetic alignment lies perpendicular to a-b or Cu-O plane and parallel to the c direction) having compositions $REBa_2Cu_3O_x$, where RE=Y, Ho, Dy, etc. or $Bi(Tl)_2Sr_2Ca_1Cu_2O_x$. On the other hand, $EuBa_2Cu_3O_x$ is an example of the so called "normal aligners" having compositions $REBa_2Cu_3O_x$ or $Bi(Tl)_2Sr_2Ca_{1-y}RE_yCu_2O_x$, where RE=Eu, Er, Tm, and Yb. In the case of normal aligners the preferred direction of the magnetic alignment lies within a-b or Cu-O plane and perpendicular to the c direction. Additionally, in the case of normal aligners one of the crystallographic directions in the a-b plane (for instance, [0k0] for superconducting $EuBa_2Cu_3O_x$) preferably aligns parallel to the magnetic field.

The energy (for a unit volume) of rotation ($E_r$) in a magnetic field is proportional to $(\chi_c - \chi_{ab})H^2$ and at room temperature the torque in a 9.4 T field was sufficient to align $YBa_2Cu_3O_x$ grains embedded in epoxy resin. This effect was demonstrated by D. E. Farrell, et al. 36 Phys. Rev. B 4025 (1987) who reported grain alignment of $YBa_2Cu_3O_x$ powder with an x-ray rocking curve width of less than 2° full width at half maximum peak intensity. However, the material obtained by this method, due to the fact that superconducting grains are surrounded by non-superconducting epoxy, has little or no technological use.

Another important phenomenon exploited in the current invention is that if a crystal or grain has an anisotropy in its physical shape (and the grains of the HTSC ceramics generally have smaller length in the c direction and longer lengths in the a and/or b directions), and is subjected to a mechanical force, then this tends to rotate the grain in such a way that the c-axes are preferentially oriented parallel to the direction of force.

FIG. 2 illustrates the believed crystal lattice structure of another superconducting ceramic material (discovered at the University of Arkansas) having a $T_c$ of $\approx 125°$ K. $TlBa_2Ca_{n-1}Cu_nO_{2n+3}$ where n=3). FIG. 2 also depicts the Cu-O basal plane, and the a, b, and c axes of the crystal lattice structure of $TlBa_2C_{n-1}Cu_nO_{2n+3}$.

Consequently to enhance $J_c$, a process capable of aligning superconducting grains within bulk superconducting samples is desirable. The present invention in one of its embodiments utilizes a two-step process. In the first step the superconducting grains, using a variety of methods, are uniaxially aligned. In the second step the present invention utilizes a strong magnetic field during the grain growth process (of polycrystalline materials having an anisotropy in a magnetic susceptibility) to produce highly, three-dimensionally textured samples. The magnetic field provides a difference in the magnetic energy between grains oriented favorably and unfavorably with respect to the direction of the applied magnetic field. Since $\Delta_\chi$ of the proportion $E_r \propto (\Delta_\chi) \times H^2$ is a physical property of a given material at a given temperature, it is necessary to increase the magnetic field strength in order to obtain a sufficient energy of rotation $E_r$ and to achieve a high degree of texture.

In another embodiment of the process the melt-textured growth technique is combined with magnetic annealing. The material is heated to a temperature exceeding its melting point, then cooled in the presence of a temperature gradient while a magnetic field of at least $10^4$ Oe is simultaneously applied. The direction of the magnetic field is set perpendicular to the direction of the temperature gradient. The process also results in three dimensional, highly textured materials.

Because $\Delta_\chi$ generally decreases with an increase in temperature it is desirable to increase the magnetic field strength. Additionally, the rate of grain growth increases dramatically as the melting point of a chosen material is approached.

When a material is heated to a near melting point temperature and grain growth occurs in the absence of a sufficiently strong magnetic field ($\leq 10^4$ Oe), the larger size grains, due to a surface energy term (related to the curvature of grain surfaces), expand at the expense of the smaller grains. This process does not generally result in a preferred orientation. However, if a material is placed in a sufficiently strong magnetic field ($>10^4$ Oe), so that the magnetic term dominates the surface energy term, the grains with favorably oriented crystallographic orientation, due to curvature of the surface, will grow at the expense of adjacent unfavorably oriented grains without regard to their size. Also, if the temperature is slowly reduced while subjected to the influence of a strong magnetic field from the one above the melting point, the spatial expansion (growth) of the grains is much faster for those grains favorably oriented with respect to the direction of the field. Additionally, the strong magnetic field may physically rotate grains and grain nucleous in a preferred direction. This process results in highly textured samples. The grains can grow to a large size, becoming single crystals. Single crystals prepared according to the process can be cut out of the matrix or, depending on the purpose, can be used inside the (superconducting) matrix.

One can visualize the process of grain growth in the field as being analogous to domain alterations in ferromagnets. In the unmagnetized state the domains are generally randomly oriented, but as the sample is magnetized, the domain walls shift, creating larger domains which have their magnetic moments oriented along the external magnetic field. The difference is that in the present process the entire crystal structure tends to shift in a preferred direction as the grain boundaries move. Another difference between the two is that the shift of the domain walls is a fast rate process. On the contrary, the structure shift is a relatively slower process because it is mediated by diffusion. Some texture may be obtained with weaker magnetic field strengths ($\leq 10^4$ Oe) if a material is subjected to a weak field (while at near melting point temperatures) for extended periods. However, such an approach may only uneconomically and ineffectively be utilized to produce high degree of texture required in modern applications.

A method of preparing highly c-axis textured bulk ceramic materials has been shown by A. Holloway, et al., in U.S. Pat. No. 5,079,225 "Process and Apparatus For Preparing Textured Crystalline Materials Using Anisotropy in the Paramagnetic Susceptibility" by A. Holloway in "Bulk C-axis Texture in Ho-Ba-Cu-O Material Produced by Magnetic Annealing" 70 J. Appl. Phys. 5716 et seq. (1991) and also by P. deRango, et al., in "Texturing of Magnetic Materials at High Temperature by Solidification in a Magnetic Field", 349 Nature 770 et seq. (1991). Significant c-axis texture was achieved by this method both on the surface and in the bulk of HTSC samples. The first experiment by M. R. Lees, et al., in "Transport Properties of Magnetically Textured $YBa_2Cu_3O_x$", 191 Physica C, 414 et seq. (1992), where the critical transport current density measurements were performed on the c-axis textured materials prepared by the magnetic annealing method, has yielded high $J_c$ (exceeding $1.5 \times 10^4$ $A/cm^2$ at 77 K in the presence of the magnetic field as high as 6.9T). Recently, D. Braithwaite, et al., in "Scaling Properties of the Anisotropic Critical Current Density in Bulk Textured YBaCuO. Evidence Towards a 3d Flux Line Lattice" J. Low Temperature Physics, in press, demonstrated that the $J_c$ in magnetically-textured samples is significantly superior to $J_c$ in melt-textured samples. Apparently, the optimization of processing conditions in the magnetic annealing process along the lines described in Holloway et al., U.S. Pat. No. 5,079,225 will bring further enhancements of the $J_c$ values. However, the aforementioned documents do not teach the application of heat treatment in a magnetic field to produce bi-axially textured materials.

There are other techniques that yield strong c-axis texture that also offer significant increase of $J_c$'s. For instance, YBCO materials with large c-axis aligned grains, high density, and cleaner grain boundaries, obtained by melt-textured growth by S. Jin et al., 37 Phys. Rev. B 7850 et seq. (1988) and by S. Jin, et al., 52 Appl. Phys. Letters 2074 et seq. (1988) or liquid phase processing by K. Salama, et al., 54 Appl. Phys. Letters 2352 et seq. (1989) and by K. Chen et al., 56 Appl. Phys. Letters 2675 et seq. (1990) demonstrate a sharp gain in $J_c$. Also, the c-axis texture obtained on BSCCO (Bi-2223)-Ag tape permitted to achieve a high critical current density $J_c$ (of the order of $10^5$ $A/cm^2$ extending above 25-T at 4° K. as reported by K. Sato, et al. MAG-27 IEEE Trans. Magn. 1231 et seq. (1991), or $5 \times 10^4$ $A/cm^2$ at zero field at 77° K. as reported by K. Sato, et al. 70 J. Appl..Phys. 6484 et seq. (1991)) significantly exceeding the performance of the best low temperature superconductors. C-axis texture in the case of Bi-Pb-Sr-Ca-Cu-O ribbons, in spite of the in-plane misorientation of the (001) textured grains, allowed S. Jin, et al., 58 Appl. Phys. Letters 868 et seq. (1991) to obtain $J_c$ as high as $2.3 \times 10^5$ $A/cm^2$ at 8 T and at 4° K. However, the problem with highly anisotropic Bi-based or Tl-based superconductors is that $J_c$ degrades rapidly with an increase in the temperature (when the imposed field is strong) or magnetic field (when the operating temperature is high) which is probably due to weak flux pinning.

On the other hand, YBCO materials exhibit a much stronger flux pinning at high temperatures so that high $J_c$ (at the liquid nitrogen temperature in strong magnetic fields) were obtained in thin films. On the other hand, experiments by D. Dimos, et al., 61 Phys. Rev. Lett. 219 et seq. (1988) and by D. Dimos, et al. 41 Phys. Rev. B. 4038 se seq. (1990), showed a drastic degradation of $J_c$ at grain angles larger than approximately 10° which would indicate an intrinsic limitation for RE-BCO materials. The success with melt-textured processing and liquid phase processing in greatly reducing weak links demonstrates that the problem may be partially solved by producing a highly textured plate-like (c-axis textured) morphology. Unfortunately these types of processing are extremely slow and require sequential growth along the entire length of conducting object. Those methods are ill suited for continuous processing (processing of tapes and wires). Also a-b planes misalignment of the materials produced by that technique remains a problem which prevents realization of the full potential of the RE-BCO compounds. The aforementioned documents do not teach the application of heat treatment in a magnetic field to produce bi-axially textured materials.

To close the gap completely between $J_c$'s for polycrystalline samples on one hand and single crystals on the other, it is instrumental, apart from producing c-axis texture, to liquidate the mismatch in a-b axes registry or weak links between adjacent grains. When those goals are achieved, it is commonly believed, that the very high $J_c$'s in textured compacts will be attained, perhaps, like in single-crystalline samples.

To produce bi-axial texture on YBCO thin films, Y. Iijima, et al., 60 Appl. Phys. Lett. 769 et seq. (1992) first formed by ion-beam assisted deposition biaxially oriented buffer layers of yttria stabilized zirconia on polycrystalline, Ni-based alloy, and then YBCO thin films were deposited by laser ablation. However, Y. Iijima, et al., do not teach a method of preparing highly c-axis textured bulk ceramic materials. This document additionally does not teach the application of heat treatment in a magnetic field to produce bi-axially textured materials.

To produce bi-axial or three-dimensional alignment of superconducting grains, it was proposed (by F. Chen, et al., 58 Appl. Phys. Lett. 531 et seq. (1991) and by B. C. Giessen, et al., U.S. Pat. No. 5,114,905), to treat normal aligners first in the magnetic field in order to align a particular axis in the a-b plane, while a second force (like mechanical pressure, for example) is applied either concurrently or sequentially, to align the c-axes in a direction perpendicular to the magnetic field direction. It is so far known that normal aligners have compositions $REBa_2Cu_3O_x$ or $Bi(Tl)_2Sr_2Ca_{1-y}RE_yCu_2O_x$, where RE=Eu, Er, Tm, and Yb. In the case of normal aligners the preferred direction of the magnetic alignment lies within the a-b or Cu-O plane and is perpendicular to the c direction. Additionally, one of the crystallographic directions in the a-b plane (for instance, [0k0] for superconducting $EuBa_2Cu_3O_x$) preferably aligns parallel to the magnetic field. The present invention is not an extension of the previous art, in particular, the above mentioned work by F. Chen, et al. for at the following reasons: (1) in Chen's case, a magnetic field does not produce a c-axis alignment. Additionally, in their case, the order of the application of the magnetic force and mechanical force cannot be reversed. In the present invention, in the first step, (in the two-step process), the c-axis alignment is produced by a variety of approaches, mainly by using two perpendicularly directed magnetic fields or rotation in a field of a single magnet and only then the strong magnetic field is applied. The order cannot be reversed in the present invention either; (2) Chen, et al., do not use a heating at near melting point to initiate substantial grain grown combined with a strong magnetic field; (3) a c-axis alignment, inflicted by a mechanical compression in the Chen's case, extends only to relatively shallow depth ($\approx 30$ μm) from the surface; (4) a binder, where ceramic grains in the Chen's case are initially placed, prevents a superconducting flow altogether. Removing the binder presents a significant difficulty.

In the present invention a modification of a magnetic texturing technique is used in which not only one (c-axis) of the grains will be aligned but which results in the bi-axial or three-dimensional alignment within the bulk of HTSC compacts.

Embodiment 1

Prepare Three-Dimensional Textured Bulk Materials

Figure 3B:
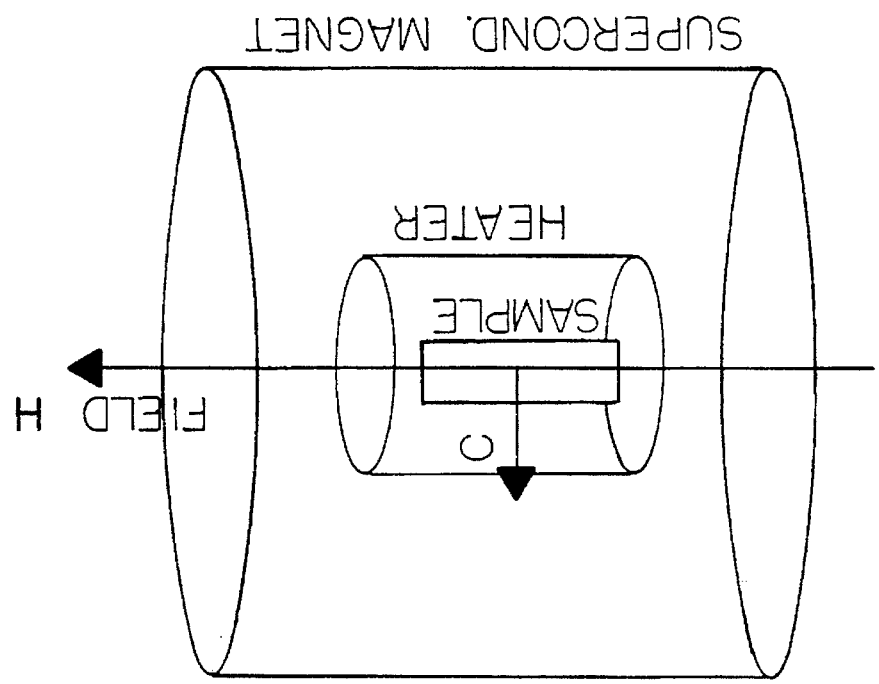
FIG. 3B is a second diagrammatic view of an apparatus for preparing 3-D textured bulk materials in a two-step process in accordance with the present invention.
Figure 3A:
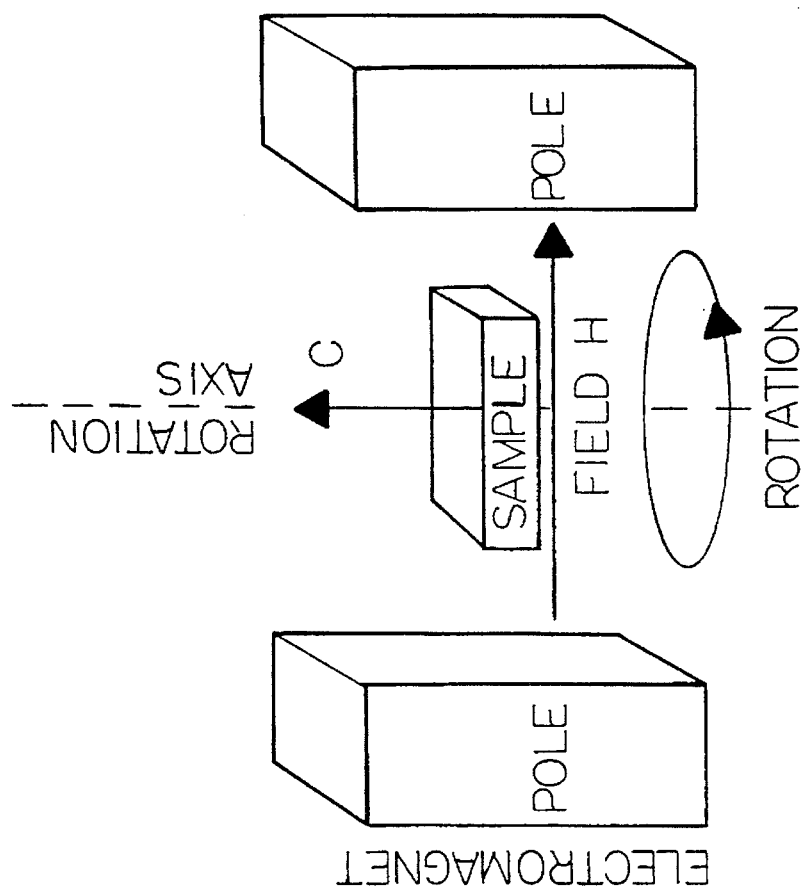
FIG. 3A is a diagrammatic view of an apparatus for preparing 3-D textured bulk materials in a two-step process in accordance with the present invention.

It should be possible to achieve full alignment in the case of normal aligners with the help of the following two-step process, the example of the embodiment of which is illustrated on the FIG. 3. In the first step one may (a) prealign the grains in the magnetic field of an ordinary electromagnet or a superconducting magnet. This may be achieved by slowly rotating the powder sample along the vertical axis in the field of a magnet directed horizontally as shown on the left side of FIG. 3. The resulting material ($EuBa_2Cu_3O_x$ in this case) acquires a high degree of c-axis alignment (directed vertically).

In the second step one may (b) heat the vertically positioned sample to a temperature approximating the material's melting point (the temperature at which intensive grain growth occurs) while simultaneously applying a strong vertically directed 10 Tesla magnetic field (as shown on the right side of the FIG. 3) from a superconducting magnet to direct the grain growth. In step 2, the compacted sample may also be positioned horizontally in a horizontally directed field of a superconducting magnet. The result is a three-dimensionally, highly textured material with the crystallographic orientation ([0k0] in the case of $EuBa_2Cu_3O_x$ material) of grains corresponding to the maximum paramagnetic susceptibility lying parallel to the applied magnetic field.

Figure 4C:
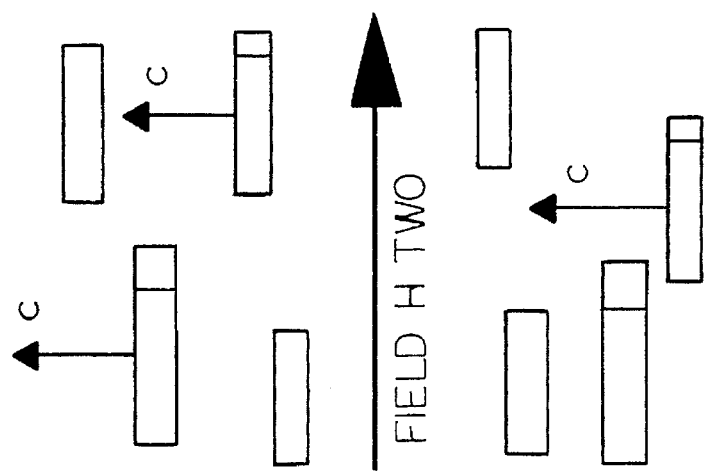
FIG. 4C is a diagrammatic view of the third step of the process begun in FIG. 4A.
Figure 4B:
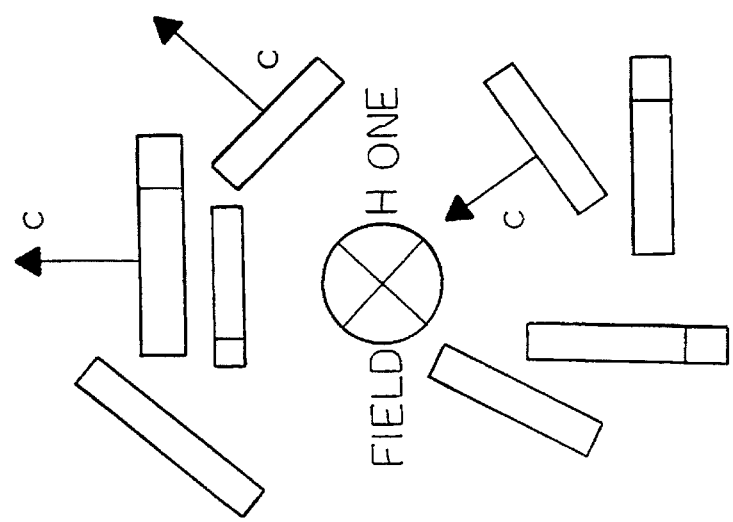
FIG. 4B is a diagrammatic view of the second step of the process begun in FIG. 4A.
Figure 4A:
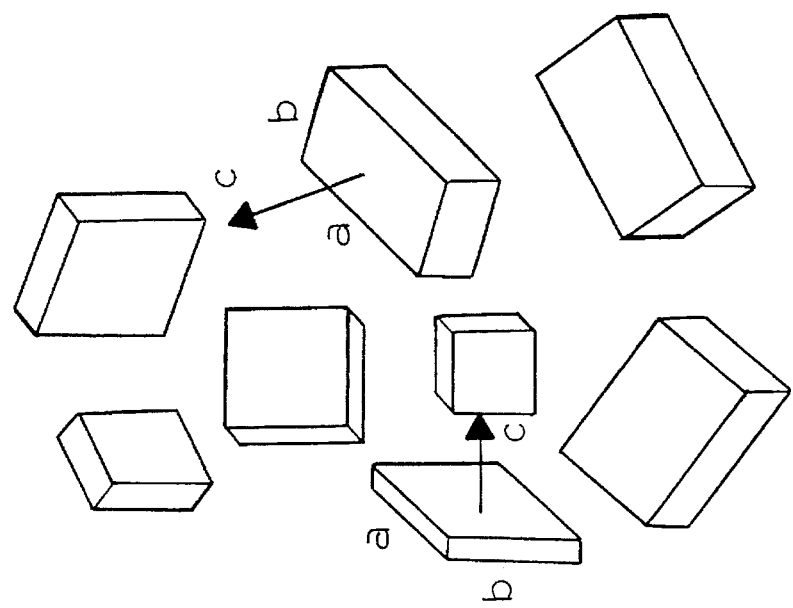
FIG. 4A is a diagrammatic view of the first step in a process resulting in the c-axis alignment of a $EuBa_2Cu_3O_x$ superconducting powder sample, wherein two mutually perpendicular magnetic fields are applied sequentially in accordance with the present invention.

The material may be subjected in Step 1 to a sequence of two mutually perpendicular magnetic fields to achieve the c-axis alignment. Let's assume that the powder grains are placed in a liquid medium (or binder) and that the grains are initially completely randomly oriented (this is illustrated on the left side of FIG. 4). A liquid medium supports the grains without stacking and at the same time allows the grains to rotate relatively freely. Next, assume that the magnetic field is directed into (or out of) the plane of the FIG. 4 which should, since one is dealing with normal aligners, bring a-b plains parallel to the field (see central part of the FIG. 4). Then, the sample may be subjected to another magnetic field lying horizontally and in the plane of FIG. 4. This should cause a-b plains to rotate a second time making them parallel to that new field direction. Geometrical considerations show that as the result of these two rotations, the grains are c-axis aligned (see the right part of the FIG. 4).

To achieve the goals of Step 1, there are various options, such as using more than two magnetic fields on the first stage for the enhancing of alignment. The magnetic fields should be applied separately. The similar resultant c-axis alignment can also be achieved by slowly rotating a sample in the field of a single magnet as illustrated in the FIG. 3.

The liquid medium (or binder) may be removed by burning it off at relatively low temperatures or by drying it in the field. The aligned powder may then be compressed in preparation for Step 2. It should be noted that the material, after Step 1, is c-axis aligned, but a-b planes misaligned.

Figure 5B:
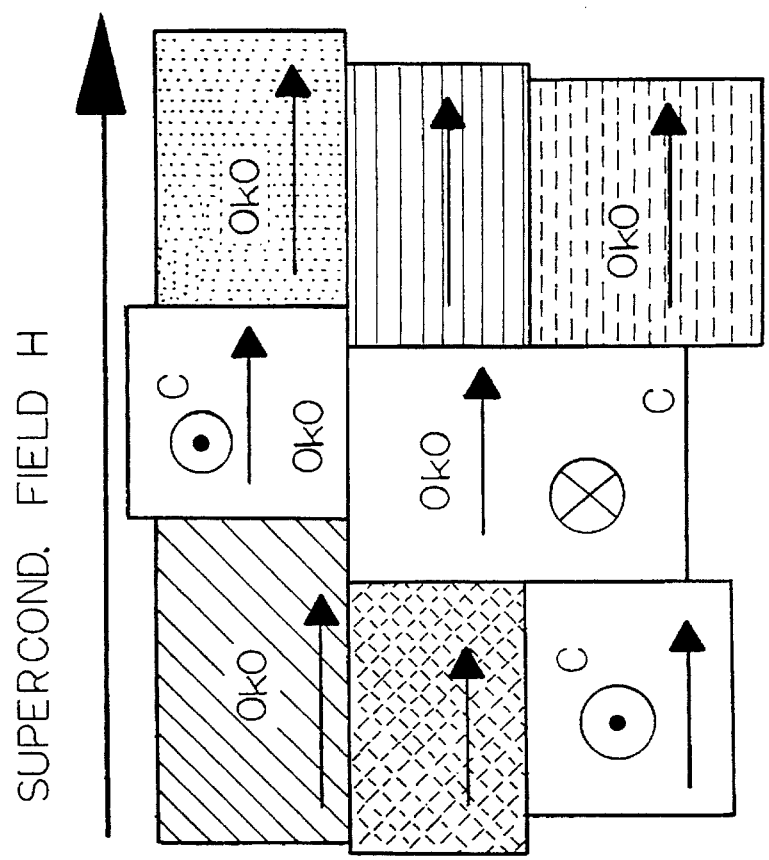
FIG. 5B is a diagrammatic view of the second step of the process begun in FIG. 5A.
Figure 5A:
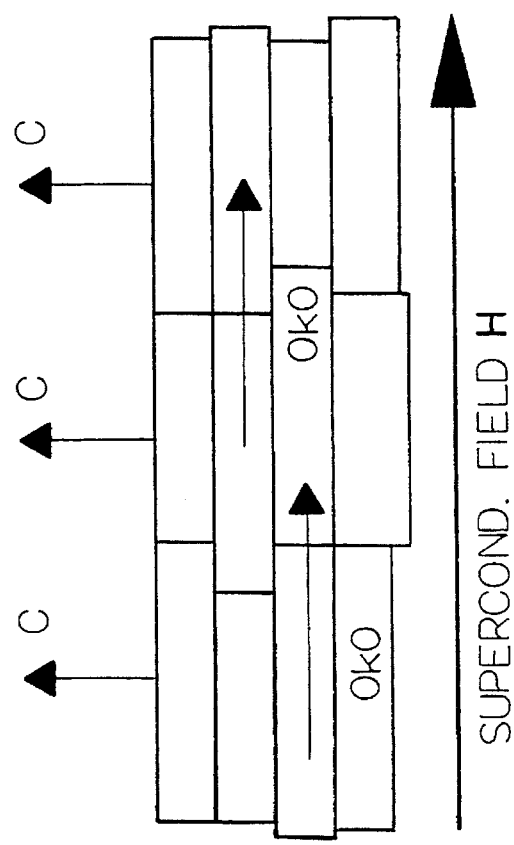
FIG. 5A is a diagrammatic view of the first step in a process resulting in the [0k0]-axis alignment of $EuBa_2Cu_3O_x$ superconducting compact sample, a strong horizontally directed field of a superconducting magnet is applied perpendicular to the c-axis direction while maintaining the sample at a temperature approaching its melting point in accordance with the present invention.

In the second step this c-axis aligned, compacted material is placed into a strong magnetic field in such a way that its c-axis is perpendicular to the direction of the field (as shown in FIG. 5, left side view), and heated to high enough temperatures to initiate considerable grain growth. In this case the combined field and heat treatment will not change the orientation of the c-axes, but will align the [0k0]-axes, lying within a-b planes (in the instance of superconducting $EuBa_2Cu_3O_x$), preferentially parallel to the field direction (see FIG. 5, right top view). Additionally, this combined field and heat treatment will substantially increase the grain size. The resultant bulk material will have three-dimensional (3-D) alignment and, as believed, the most favorable arrangement for the transport current flow. In order to maximize the magnetic energy term (and speed-up the rate of grain growth) it is necessary to use the maximum achievable magnetic field. It is advantageous to use a high-field furnace built inside a bore of a superconducting magnet with a field of the order of 10 Tesla. A high-field furnace, used during step 2, has been described in Holloway et al., U.S. Pat. No. 5,079,225.

At the near melting point processing temperatures a significant fraction of $RE\text{-}Ba_2Cu_3O_x$ grains may be lacking some of the oxygen content and exist not in the orthorombic state (when a [n00] and b [0k0] directions are distinctly different but in the tetragonal state (when a and b directions are indistinguishable). Tetragonal $Re\text{-}Ba_2Cu_3O_x$ (when RE=Er, Eu, Tm, Yb and when x is less than 7) in a sufficiently strong magnetic field being subjected to high temperature during step 2 will regrow or turn in such a way that a and b directions (which are equivalent in the case of the tetragonal symmetry) will be parallel to the field direction. The reason for this is that the normal state paramagnetic susceptibility $\chi$ is higher in a [n00] and b [0k0] directions in the tetragonal case than for any other directions within a-b plane. On the other hand, for orthorombic $RE\text{-}Ba_2Cu_3O_x$ (when RE=Er, Eu, Tm, Yb and when x is close to 7) x in the b direction is essentially larger than $\chi$ in the a direction (and $\chi$ in the c direction). It was reported by M. V. Eremin et al., 4 Superconductivity 625 et seq. (1991) that g-factors are $g_a=7.1$, $g_{b=8.4}$, and $g_c=4.1$ in the orthorombic $ErBa_2Cu_3O_x$ case and $g_a=3.506$, $g_b=3.732$, and $g_c=2.992$ in the orthorombic $YbBa_2Cu_3O_x$ case. In order to preferentially select the bi direction at the expense of the a direction, one may while in the presence of a strong magnetic field slow cool $RE\text{-}Ba_2Cu_3O_x$ sample in the oxygen atmosphere. The magnetic field during oxygen uptake selects b direction parallel to itself, whereby producing bi-axial texture. Additionally, when the magnetic field is applied all the way to a low enough temperatures, it prevents the emergence of twin boundaries because b direction is preferred over a direction in the whole temperature range.

Once cooled, the material may be removed from a magnet and further processed for utilization in electrical, electronic, mechanical, optical or other components. Oxygen annealing may be used during or after stage two.

The similar procedure can also be used for producing 3-D textured thin and thick films.

Embodiment 2

Prepare Three-Dimensional Textured Superconducting Tapes

It was explained by A. Holloway, et al., in the U.S. Pat. No. 5,079,225 "Process and Apparatus For Preparing Textured Crystalline Materials Using Anisotropy in the Paramagnetic Susceptibility" that to produce useful elongated objects like wires or tapes, one has to utilize normal aligners, like, for example, $EuBa_2Cu_3O_x$. It was concluded in this case that the Cu-O layers would be aligned within the axis of the wire, enhancing the critical current density $J_c$.

Figure 6:
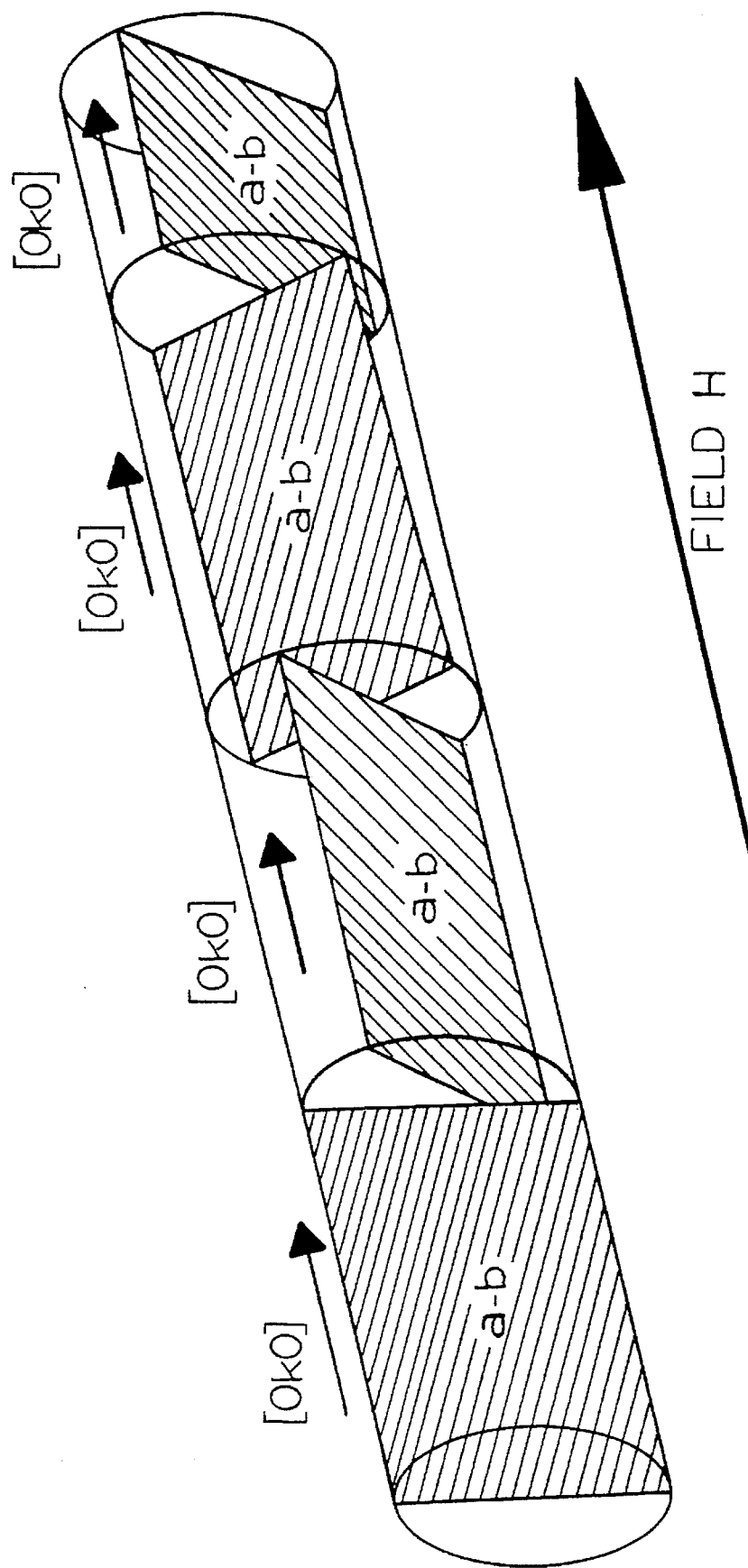
FIG. 6 is a diagrammatic view of a wire made from $EuBa_2Cu_3O_x$ material, where a-b planes are aligned within the wire axis and parallel to a magnetic field, wherein the [0k0]-axes of the grains constituting the wire are aligned and the a-b planes of adjacent grains may be misaligned.

However, Cu-O planes of two adjacent grains may remain misaligned relative to one another, as in the example of the wire illustrated in FIG. 6. Filled rectangulars on the FIG. 6 are Cu-O (a-b) planes. As seen from FIG. 6, the a-b planes are parallel to the direction of the magnetic field H. FIG. 6 also shows that the direction of one of the axes located within the (a-b) plane (the [0k0] axes in the case of the superconducting $EuBa_2Cu_3O_x$ material) of all the constituent grains are preferentially aligned with the field direction.

This arrangement, even without any improvements, may very well be good enough for the superconducting critical current density achieved thereby to reach a magnitude sufficient for many industrial applications.

However, to achieve the full potential supercurrent-carrying capability of the HTSC materials it might be advantageous to inflict three-dimensional texture on the elongated objects like, for example, tapes. An illustration of a two-step process able to produce 3-D alignment (when mechanical compression is used in the first step) is illustrated by the FIG. 7 (in which the compound $EuBa_2Cu_3O_x$ is used). A powder is deposited on a slowly moving tape support and is treated in the first step in such a way that the powdered material becomes c-axis aligned. Then in the next step the aforementioned c-axis aligned powder on the advancing tape is inserted into a strong (~$10^5$ Oe) magnetic field so that the axis of the tape is parallel to the direction of the field. Simultaneously, the tape is heated to a high temperature so that substantial grain growth occurs. The high-field furnace, used during step 2, is described in Holloway et al., U.S. Pat. No. 5,079,225. In addition to the c-axis alignment, the combined action of the magnetic field and heat aligns another crystallographic axis located within the a-b or Cu-O basal plane parallel to the field ([0k0] in the instance of superconducting $EuBa_2Cu_3O_x$), making the alignment three-dimensional and the most favorable for the superconducting transport current. A beneficial side-effect that occurs during the second step of the process is that the grains experience considerable growth in size, which in turn promotes their strong coupling and further enhances the transport properties. A similar procedure may be applied to ceramic wires and fibers also.

The Cu-O (or a-b) planes, as a result of the first part of the process, are preferentially aligned parallel to the surface of a substrate on which the grains are deposited; in other words, the a-b planes are preferentially directed perpendicular to the axis of compression. It is said, in this case, that the grains are "preferentially c-axes aligned". On the other hand, the [0k0]-axes are misaligned (completely or partially) after this first stage.

In the next step, this partially aligned (or textured) tape/wire is pulled through a strong magnetic field parallel to its axis while simultaneously being heated to a substantial degree, thereby initiating considerable grain growth. This combined field and heat treatment performs at least three useful functions: (a) it further increases the degree of c-axis alignment by rotating the a-b planes parallel to the field direction; (b) it substantially increases the grain size; and (c) it aligns the [0k0]-axes preferentially so as to be parallel to the field direction.

Figure 7:
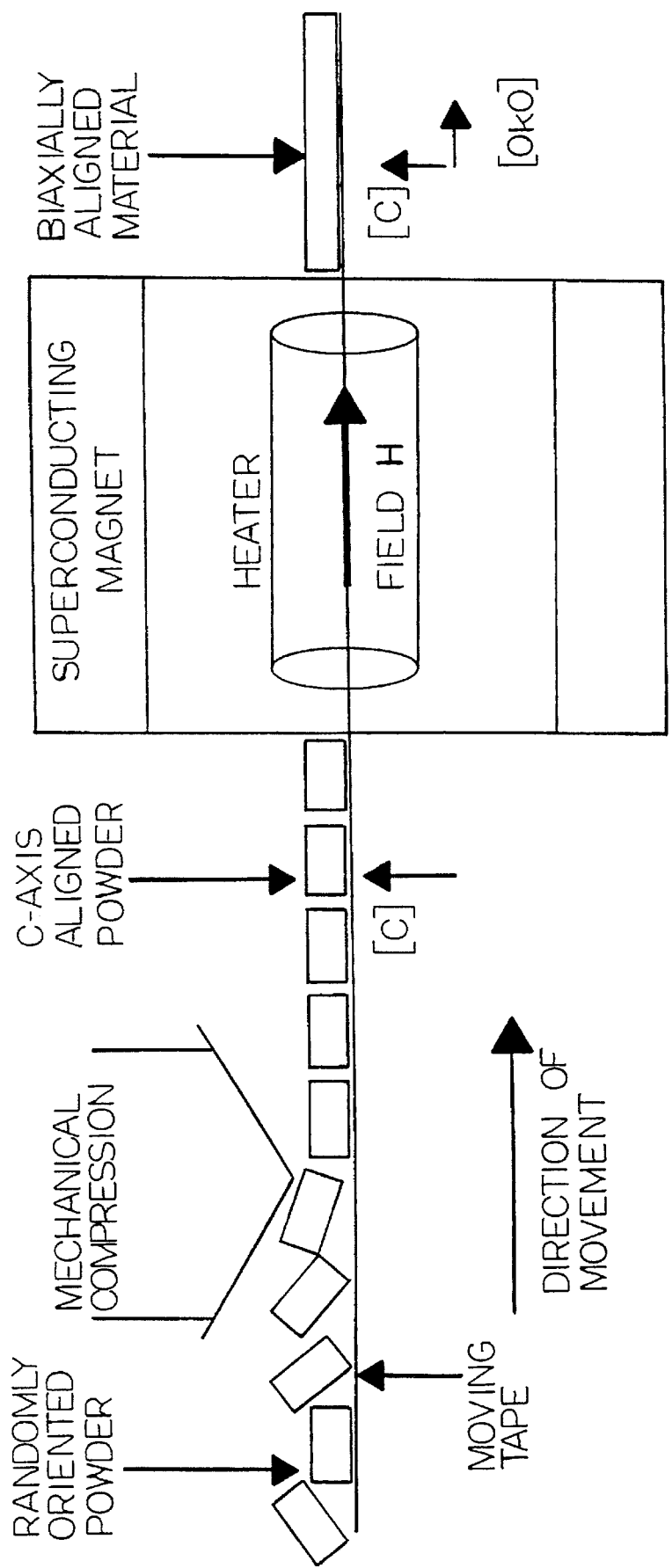
FIG. 7 is a diagrammatic view of an apparatus for preparing 3-D textured elongated materials (like tapes) in a two-step process according to the present invention.

The mechanical (rolling or compression) alignment used as an example in the first step of the process (as illustrated by FIG. 7) has some shortcomings (1) it is generally not perfect even on the surfaces, (2) decreases with the depth in the bulk of the sample (the alignment becomes practically zero at the depth below 30 µm), and (3) also may break some grains. An alternative approach for the first step involves using the coupling between gravity and anisotropy in the shape of grains. For example, grains initially suspended in a liquid that slowly evaporates tend to become deposited with their widest planes (which would be the a-b planes) parallel to the surface of the substrate, automatically producing c-axis alignment. Unfortunately, it would seem that only very thin layers can be aligned by this technique.

Another and more promising approach in producing c-axis alignment during step one is to utilize at least two mutually perpendicular magnetic fields lying in the plane of the tape. If we suppose that the powder grains are placed in a liquid medium (or binder) and further suppose (for simplicity) that the tape is horizontal as in FIG. 7, then the first magnetic field directed into (or out of) the plane of FIG. 7 (since one is dealing with normal aligners) will bring the a-b planes parallel to that field. Then as the tape advances, it may be subjected to another magnetic field lying horizontally and in the plane of FIG. 7. The a-b planes will rotate a second time in order to become parallel to that new field direction. Geometrical considerations show that, as a result of these two turns, grains will be c-axis aligned. The liquid medium may then be removed by burning between the first and the second stages or it may be removed in the second stage by virtue of the high processing temperatures involved therein. Different options are possible, like using more than two magnetic fields in the first stage to improve alignment. Conversely, only one (first) magnetic field may be used in step one, because the role of the second field can be performed by the field of the superconducting magnet involved in step two. The tape support should be advancing slowly enough to give sufficient time to yield a substantial degree of alignment during both steps one and two. The c-axis aligned in the step one powder can also be mechanically compressed before being inserted in a superconducting magnet in step two.

When a significant fraction of grains at the highest processing temperatures exists in the tetragonal state, then in order to preferentially select the b direction at the expense of the a direction, one may while in the presence of a strong magnetic field slow cool $RE-Ba_2Cu_3O_x$ (when RE=Er, Eu, Tm, Yb) tape in the oxygen atmosphere. The magnetic field during oxygen uptake selects b direction parallel to itself, whereby producing bi-axial texture. Additionally, when the magnetic field is applied all the way to a low enough temperatures, it prevents the emergence of twin boundaries because b direction is preferred over a direction in the whole temperature range. Three-dimensional texture on the tape is obtained, which is believed to be the best from the transport current density point of view because it matches the structural features of single crystals most closely. Once it leaves the superconducting magnet, the tape/wire may be further processed for utilization in electrical, electronic, mechanical, optical or other components. Oxygen annealing may also be used during or after stage two.

The similar procedure can also be used for producing 3-D textured thin and thick films.

Embodiment 3

Prepare Three-Dimensional Textured Bulk Materials Using Melt-Textured Growth Combined With Magnetic Annealing It has been explained in Holloway et al., U.S. Pat. No. 5,079,225 that to produce useful bulk objects one has to utilize the combined action of a strong magnetic field and sufficiently high temperatures in order for considerable grain growth to occur. The temperature may also exceed the material's melting point or be cycled above and below the melting point for some time. It was concluded that as the result of this treatment (a) the resultant material will be textured/aligned, and (b) that the sizes of the grains produced thereby will increase, which should enhance the critical current density $J_c$. This version of magnetic texturing technique, even without any further improvements, may increase the superconducting critical current density to the magnitude desired for many industrial applications. This version of the technique was used by M. R. Lees, et al., in "Transport Properties of Magnetically Textured $YBa_2Cu_3O_x$", in 191 Physica C, 414 et seq. (1992). Here the critical current density measurements were performed on the c-axis textured materials prepared by the magnetic texturing method, which yielded high $J_c$ (exceeding $1.5 \times 10^4$ A/cm$^2$ at 77° K. in the presence of the magnetic field as high as 6.9T). This same version of magnetic texturing technique was also used more recently by D. Braithwaite et al., in "Scaling Properties of the Anisotropic Critical Current Density in Bulk Textured YBaCuO. Evidence Towards a 3d Flux Line Lattice" J. Low Temperature Physics, in press, who demonstrated that the $J_c$ in magnetically textured samples is significantly superior to $J_c$ in melt-textured samples.

Figure 8:
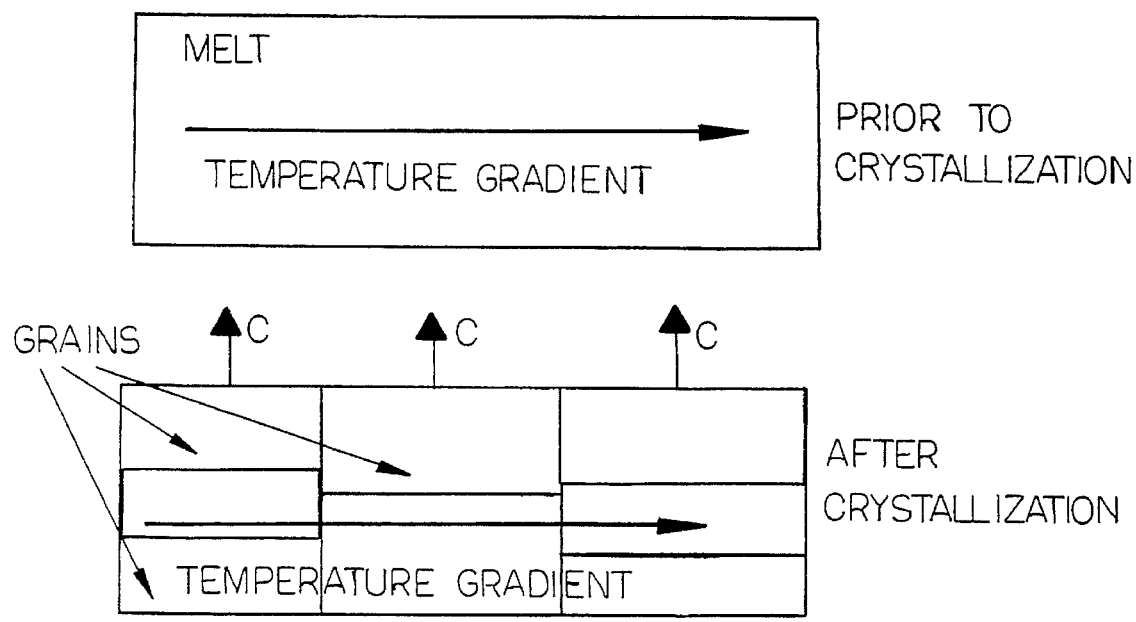
FIG. 8 is a diagrammatic view of the effect of a temperature gradient in the melt-textured growth wherein the c-axes of the grains obtained as a result of the solidification in the temperature gradient are directed perpendicular to the gradient.

In another technique, which has been used by a number of researchers (for instance, by S. Jin, et al., 37 Phys. Rev. B. 7850 et seq. (1988) and by S. Jin, et al., 52 Appl. Phys. Lett. 2074 et seq. (1988)), called "melt-textured growth" the processing temperature exceeds the melting point of a material (so that only a liquid phase exists or a liquid and solid phase coexist), then the material is slowly cooled in the presence of a temperature gradient. The presence of the temperature gradient causes directional crystallization of the material in such a way that the a-b planes of resultant grains are now directed parallel to the gradient (in other words, the c-axes of the same grains are now perpendicular to the gradient). The simplified schematic of this process is illustrated in FIG. 8. The top part of FIG. 8 schematically shows the situation prior to solidification. On the bottom portion of FIG. 8, which shows the final arrangement after cooling has been accomplished, the grains have their c-axes normal to the direction of the temperature gradient. This arrangement is called "c-axis alignment (or texture)". The shortcoming of melt textured materials is that the a-b or Cu-O planes remain in-plane misaligned, or aligned only in the short order sense.

Figure 9:
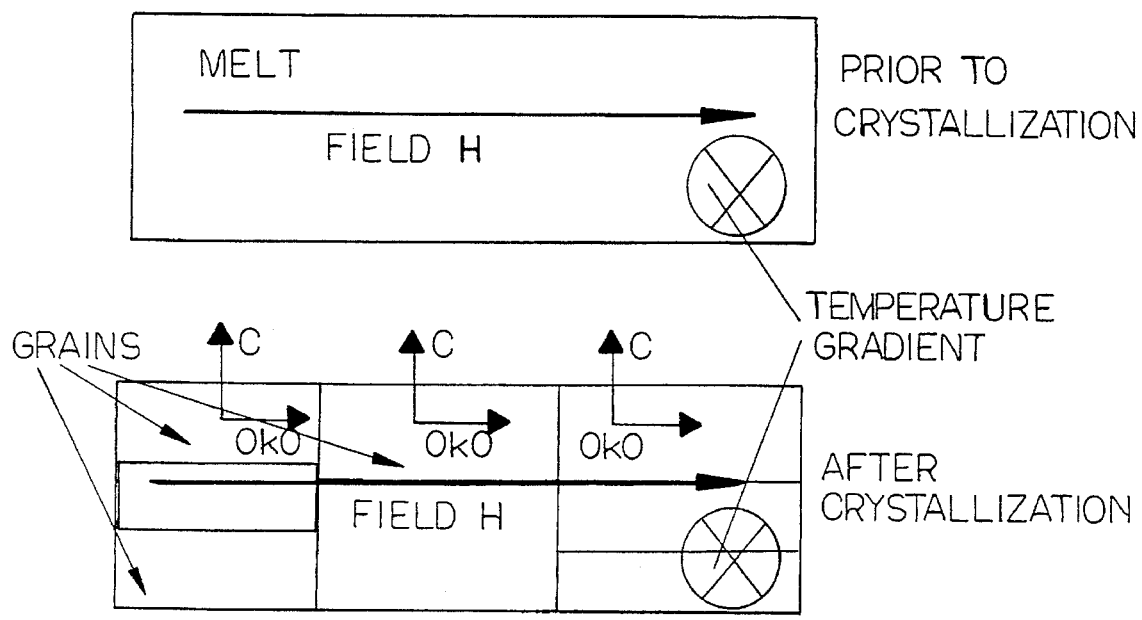
FIG. 9 is a diagrammatic view of the combined effects of a temperature gradient and a strong magnetic field, wherein the c-axes of the grains, obtained as a result of the solidification, are directed perpendicular to the temperature gradient, and [0k0]-axes are directed parallel to the field.

The current invention uses normal aligners and the combination of both magnetic annealing and melt-textured growth techniques. The applied temperatures approach or exceed the material's melting point first, and then the material is slowly cooled in the presence of a temperature gradient, for instance, directed horizontally. In addition to this, a strong magnetic field should be applied also horizontally, but in the direction perpendicular to the direction of the temperature gradient, as shown in FIG. 9. This experimental arrangement produces a material with bi-axial or three-dimensional texture. In this case the influence of the magnetic field does not change the orientation of the c-axes (or, in other words, the orientation of the a-b planes); it may even help to align the c-axes more effectively. But most importantly, the strong magnetic field will align the [0k0]-axes (in the instance of $EuBa_2Cu_3O_x$) preferentially in a direction parallel to that of the applied magnetic field (see FIG. 9 bottom). Additionally, the field may possibly increase the grain size to a substantial degree. In this embodiment, contrary to the first two described above embodiments, where two different processing steps were used sequentially the application of the temperature gradient and strong magnetic field should be done simultaneously. Oxygen annealing may be used during the process.

When a significant fraction of grains at the highest processing temperatures exists in the tetragonal state, then in order to preferentially select the b direction at the expense of the a direction, one may while in the presence of a strong magnetic field slow cool $RE-Ba_2Cu_3O_x$ (when RE=Er, Eu, Tm, Yb) tape in the oxygen atmosphere. The magnetic field during oxygen uptake selects b direction parallel to itself, whereby producing bi-axial texture. Additionally, when the magnetic field is applied all the way to a low enough temperatures, it prevents the emergence of twin boundaries because b direction is preferred over a direction in the whole temperature range.

Continuous processing for this embodiment is also possible if a tape/wire of (may be compressed) superconducting material is advanced through a superconducting magnet with the temperature gradient directed perpendicular to the direction of the magnetic field.

The resultant material has three-dimensional alignment, and, as believed, the most favorable arrangement for transport current flow. Once cooled, the material may be removed from the apparatus and further processed for utilization in electrical, electronic, mechanical, optical or other components.

The similar procedure can also be used for producing 3-D textured thin and thick films.

Other Embodiments

The temperature of the un-textured or partially textured material during Step 2 of embodiments 1 and 2 and also in the embodiment 3 may also be cycled above and below its melting point for 1 second or greater intervals in order to increase the diffusion speed. Caution, in some circumstances, should be exercised not to keep the material above its melting point for too long because the phase separation of the material under consideration will occur with detrimental consequences on the quality of the resultant material. This cycling process may be repeated a single time or a plurality of times. Additionally, the amount of time the material is maintained at or below its melting point may also be varied. Likewise, the range of temperatures the material is allowed to cycle between may also be controlled in order to facilitate diffusion and crystal growth.

In another embodiment the material, also during Step 2, may be allowed to cool to within 200° K. above or below the material's melting point. Fast cooling rates from the temperature above the melting point may produce metastable magnetically anisotropic second phases. Additionally, in another preferred embodiment the material is maintained at a temperature within 200° K. above or below its melting point for at least 1 second.

In yet another embodiment, a material may be heated to a temperature exceeding its melting point between 1 and 1000 times. In a further embodiment, a material may also be allowed to cool to within 200° K. above or below the material's melting point. Additionally, in another preferred embodiment the material is maintained at a temperature within 200° K. above or below its melting point for at least 1 second. Oxygen annealing may be used during these processes.

The material may be removed from the apparatus and allowed to cool. Once cooled, the material may be further processed for utilization in electrical, electronic, mechanical, or optical components.

The bulk and elongated materials produced pursuant to this process are expected to be highly, three-dimensionally textured and have $J_c$'s close to $10^6$ A/cm$^2$ at 77° K.

Whereas, the invention has been described in connection with preferred embodiments thereof, it is apparent that many additions, modifications, and substitutions may be made which are within the intended broad scope of the appended claims. For example, high pressures could be imparted on the ceramic materials before or during the disclosed process. Additionally, highly textured bulk materials might be molded during the disclosed process to form transducers and related electronic components. Also, it is expected that both high strength materials and thermally anisotropic materials may be produced by the process and apparatus of the invention.

Overhead power lines are often affected by bad storms and tornadoes which result in costly power outages. But more importantly, the close proximity of power plants to densely populated urban areas has become a serious environmental concern. The urban population is becoming increasingly uneasy about pollution due to power plants and, especially, nuclear plants. But as long as Joule (ohmic) losses continue to exist, power plants will have to be built as close to the consumer as possible.

High temperature superconductors (HTSC) can solve this problem, because HTSC transmission lines can carry electricity without Joule losses. HTSC transmission lines can be buried underground in tubes or envelopes cooled either by liquid nitrogen or by a coolant gas. High voltage is no longer necessary for the HTSC transmission lines. HTSC lines can be used in the near future in highly congested urban areas and can also be used in the longer run for a nationwide network connecting large power plants. This network would allow power companies to use the excess generating capacity of one region to help boost supply in another region where the demand is higher. HTSC can also be used in magnetic storage devices so that the excess electricity generated during night hours can be used during peak hours the following day. HTSC lines might also give a tremendous boost to nuclear power plants because they can be remotely located. That, in turn, will help to reduce the present energy dependence of the United States upon foreign sources.

On the negative side, liquid nitrogen cooling of HTSC transmission lines would cost money, but big strides have recently been made in making this kind of cooling economical. Another problem with HTSC ceramic polycrystalline materials is their so far prohibitively low critical current density. The smaller is the critical current density, the larger should be the diameter of HTSC wires which, in turn, would require larger amounts of the materials. Naturally, this would result in cost increases. The problem can be addressed by making better quality materials that allow for significantly larger critical current densities. The objective of the present invention is to make HTSC materials with a high critical current density.

Other apparent areas where the present invention may find application include but are not limited to: (1) magnetic propulsion; (2) ceramic fibers in both integrated and semi-integrated technologies; (3) magnetic storage devices; (4) components in superconducting motors; (5) levitating train technology; (6) superconducting magnets; (7) detection of weak signals; (8) microwave devices; (9) SQUIDs; (10) Josephson junction; (11) analog-to-digital converters; (12) high strength and other specialized materials; (13) thermal insulating materials; and (14) transducers requiring materials with different mechanical, magnetic, electro-conductive, thermoconductive, and optical properties different mechanical, magnetic, electro-conductive, thermoconductive, and optical properties.

Thus, there has been shown and described a process for producing 3-D textured crystalline materials from ceramics with anisotropy in the paramagnetic susceptibility.

I claim:

1. A process for producing biaxially textured materials comprising the steps of:
   (a) uniaxially aligning a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, with the use a magnetic field; and
   (b) heating said uniaxially aligned material to a temperature approximating its melting point while said uniaxially aligned material is exposed to a magnetic field of at least $10^4$ Oe, said magnetic field having a direction perpendicular to the axis of alignment produced in said uniaxial alignment, whereby a biaxially textured material is produced.

2. The process as recited in claim 1 wherein said uniaxially aligned material is heated to within 200° K. of its melting point.

3. The process as recited in claim 1 wherein the temperature of said uniaxially aligned material is cycled above and below its melting point for 1 second or greater intervals.

4. The process as recited in claim 2 wherein the temperature of said uniaxially aligned material is cycled above the materials melting point for at least 1 second.

5. The process as recited in claim 3 wherein said uniaxially aligned material is heated to a temperature exceeding its melting point at least one time.

6. The process as recited in claim 4 wherein said uniaxially aligned material is allowed to cool to within 200° K. below the material's melting point after each heating cycle above the materials melting point.

7. The process as recited in claim 1 wherein said uniaxially aligned material is maintained at a temperature within 200° K. above or below its melting point for at least 1 second.

8. The process as recited in claim 1 wherein said uniaxially aligned material is exposed to said magnetic field for at least 1 second.

9. The process as recited in claim 1 wherein said material is uniaxially aligned using a combination of two or more mutually perpendicular magnetic fields of at least 100 Oe applied 10. The process as recited in claim 1 wherein said material is uniaxially aligned using a combination of at least two magnetic fields of at least 100 Oe applied sequentially.

11. The process as recited in claim 1 wherein said material is uniaxially aligned using rotation at a slow speed in a field of a single magnet with a strength of at least 100 Oe.

12. A process for producing biaxially textured materials comprising the steps of:
   (a) uniaxially aligning a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, with the use of mechanical compression; and
   (b) heating said uniaxially aligned material to a temperature approximating its melting point while said uniaxially aligned material is exposed to a magnetic field of at least $10^4$ Oe, said magnetic field having a direction perpendicular to the axis of alignment produced in said uniaxial alignment, whereby a biaxially textured material is produced.

13. The process as recited in claim 12 wherein said uniaxially aligned material is heated to within 200° K. of its melting point.

14. The process as recited in claim 12 wherein the temperature of said uniaxially aligned material is cycled above and below its melting point for 1 second or greater intervals.

15. The process as recited in claim 13 wherein the temperature of said uniaxially aligned material is cycled above the material's melting point for at least 1 second.

16. The process as recited in claim 14 wherein said uniaxially aligned material is heated to a temperature exceeding its melting point at least one time.

17. The process as recited in claim 15 wherein said uniaxially aligned material is allowed to cool to within 200° K. below the material's melting point after each heating cycle above the material's melting point.

18. The process as recited in claim 12 wherein said uniaxially aligned material is maintained at a temperature within 200° K. above or below its melting point for at least 1 second.

19. The process as recited in claim 12 wherein said uniaxially aligned material is exposed to said magnetic field for at least 1 second.

20. A process for producing biaxially textured materials comprising the steps of:
   (a) uniaxially aligning a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, with the use of gravitational force; and
   (b) heating said uniaxially aligned material to a temperature approximating its melting point while said uniaxially aligned material is exposed to a magnetic field of at least $10^4$ Oe, said magnetic field having a direction perpendicular to the axis of alignment produced in said uniaxial alignment, whereby a biaxially textured material is produced.

21. The process as recited in claim 20 wherein said uniaxially aligned material is heated to within 200° K. of its melting point.

22. The process as recited in claim 20 wherein the temperature of said uniaxially aligned material is cycled above and below its melting point for 1 second or greater intervals.

23. The process as recited in claim 21 wherein the temperature of said uniaxially aligned material is cycled above the material's melting point for at least 1 second.

24. The process as recited in claim 22 wherein said uniaxially aligned material is heated to a temperature exceeding its melting point at least one time.

25. The process as recited in claim 23 wherein said uniaxially aligned material is allowed to cool to within 200° K. below the material's melting point after each heating cycle above the material's melting point.

26. The process as recited in claim 20 wherein said uniaxially aligned material is maintained at a temperature within 200° K. above or below its melting point for at least 1 second.

27. The process as recited in claim 20 wherein said uniaxially aligned material is exposed to said magnetic field for at least 1 second.

28. A process for producing biaxially textured materials comprising the steps of:
   (a) heating a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, to a temperature approximating its melting point; and
   (b) cooling said material in the presence of a temperature gradient while a magnetic field of at least $10^4$ Oe is simultaneously applied wherein the direction of said magnetic field is set perpendicular to the direction of the temperature gradient.

29. The process as recited in claim 28 wherein said material is heated to within 200° K. of its melting point.

30. A process for producing biaxially textured materials comprising the steps of:
   (a) heating a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, to a temperature approximating its melting point; and
   (b) cycling the temperature of said material in the presence of a temperature gradient while a magnetic field of at least $10^4$ Oe is simultaneously applied wherein the direction of said magnetic field is set perpendicular to the direction of the temperature gradient.

31. The process as recited in claim 30 wherein the temperature is cycled above and below said material's melting point within 200° K. for at least 1 second or greater intervals at least 1 time.

32. A composition of matter prepared by a process comprising the steps of:
   (a) uniaxially aligning a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, with the use of a magnetic field; and
   (b) heating said uniaxially aligned material to a temperature approximating its melting point while said uniaxially aligned material is exposed to a magnetic field of at least $10^4$ Oe, said magnetic field having a direction perpendicular to the axis of alignment produced in said uniaxial alignment, whereby a biaxially textured material is produced.

33. A composition of matter prepared by a process comprising the steps of:
   (a) uniaxially aligning a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, with the use mechanical compression; and
   (b) heating said uniaxially aligned material to a temperature approximating its melting point while said uniaxially aligned material is exposed to a magnetic field of at least $10^4$ Oe, said magnetic field having a direction perpendicular to the axis of alignment produced in said uniaxial alignment, whereby a biaxially textured material is produced.

34. A composition of matter prepared by a process comprising the steps of:
   (a) uniaxially aligning a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, with the use of gravitational force; and
   (b) heating said uniaxially aligned material to a temperature approximating its melting point while said uniaxially aligned material is exposed to a magnetic field of at least $10^4$ Oe, said magnetic field having a direction perpendicular to the axis of alignment produced in said uniaxial alignment, whereby a biaxially textured material is produced.

35. A composition of matter prepared by a process comprising the steps of:
   (a) heating a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, to a temperature approximating its melting point; and (b) cooling said material in the presence of a temperature gradient while a magnetic field of at least $10^4$ Oe is simultaneously applied wherein the direction of said magnetic field is set perpendicular to the direction of the temperature gradient.

36. A composition of matter prepared by a process comprising the steps of:

(a) heating a material selected from the group consisting of $EuBa_2Cu_3O_x$, $ErBa_2Cu_3O_x$, $TmBa_2Cu_3O_x$, and $YbBa_2Cu_3O_x$, where x is between 6 and 7, to a temperature approximating its melting point; and (b) cycling the temperature of said material in the presence of a temperature gradient while a magnetic field of at least $10^4$ Oe is simultaneously applied wherein the direction of said magnetic field is set perpendicular to the direction of the temperature gradient.

* * * * *